US007885094B2

(12) United States Patent
Min et al.

(10) Patent No.: US 7,885,094 B2
(45) Date of Patent: Feb. 8, 2011

(54) MRAM WITH CROSS-TIE MAGNETIZATION CONFIGURATION

(75) Inventors: Tai Min, San Jose, CA (US); David Heim, Redwood City, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 477 days.

(21) Appl. No.: 12/150,241

(22) Filed: Apr. 25, 2008

(65) Prior Publication Data

US 2009/0268512 A1    Oct. 29, 2009

(51) Int. Cl.
*G11C 11/00* (2006.01)
(52) U.S. Cl. ............... 365/158; 365/148; 365/171; 977/935
(58) Field of Classification Search .............. 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS

| | | | |
|---|---|---|---|
| 6,335,890 B1 | 1/2002 | Reohr et al. | |
| 6,490,217 B1 | 12/2002 | DeBrosse et al. | |
| 6,798,690 B1 * | 9/2004 | Katti | 365/158 |
| 6,798,691 B1 * | 9/2004 | Ounadjela et al. | 365/171 |
| 7,020,015 B1 * | 3/2006 | Hong et al. | 365/171 |
| 7,239,545 B2 * | 7/2007 | Hosotani | 365/171 |
| 2005/0242384 A1 | 11/2005 | Iwata et al. | |
| 2006/0013039 A1 | 1/2006 | Braun et al. | |

OTHER PUBLICATIONS

"Switching field variation in patterned submicron magnetic film elements," by Youfeng Zheng et al., J. Appl. Phys. 81(8), Apr. 15, 1997, pp. 5471-5473.
"MRAM with novel shaped cell using synthetic anti-ferromagnetic free layer," by Y.K. Ha et al., 2004 Symposium on VLSI Techology, Digest of Tech. Papers, pp. 24-25.

* cited by examiner

*Primary Examiner*—Richard Elms
*Assistant Examiner*—Harry W Byrne
(74) *Attorney, Agent, or Firm*—Saile Ackerman LLC; Stephen B. Ackerman

(57) ABSTRACT

The incidence of half-select errors during MRAM programming has been significantly reduced by giving the free layer a shape that approximates an X so that, when the free layer switches, the magnetization in the arms of the X guides the magnetization in the central section (the X's intersection area) causing it to rotate towards the hard axis in two opposing directions. This raises the free layer's switching energy barrier, thereby reducing half-select errors.

22 Claims, 9 Drawing Sheets

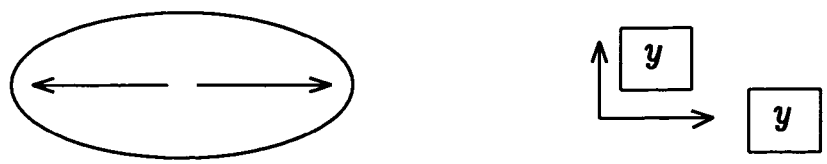
FIG. 1a - Prior Art
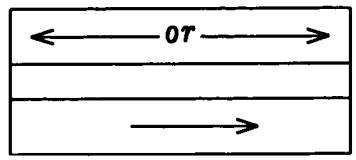
FIG. 1b - Prior Art
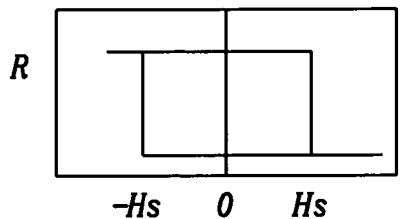
FIG. 2 - Prior Art
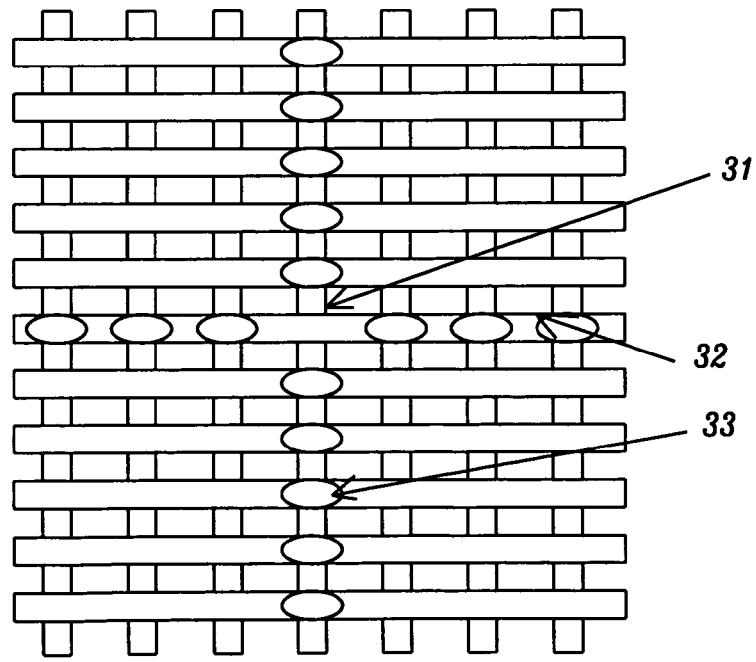
FIG. 3 - Prior Art

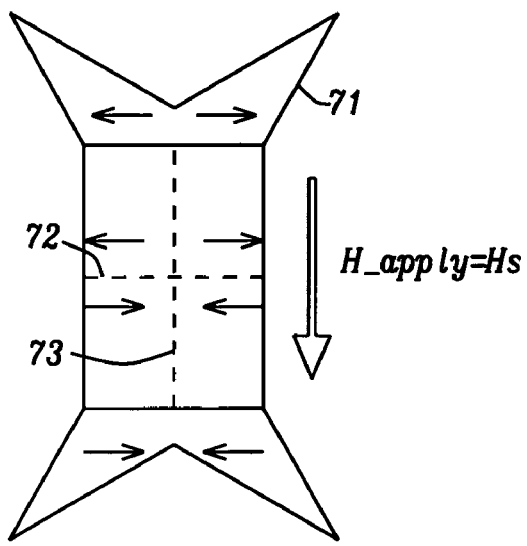 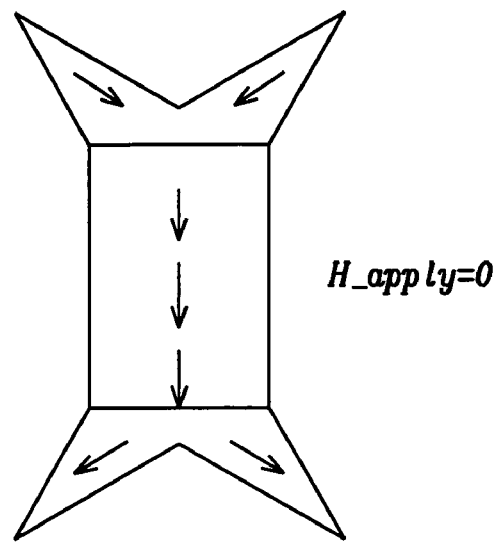
FIG. 7c    FIG. 7d
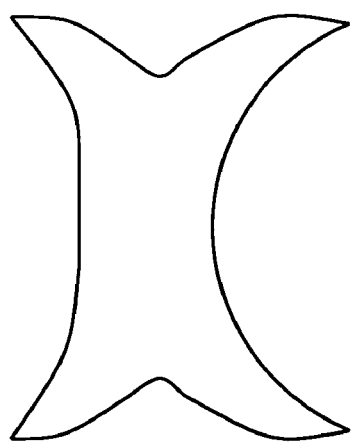 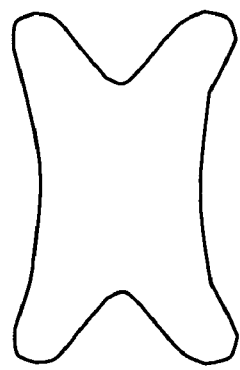
FIG. 8a    FIG. 8b

MRAM WITH CROSS-TIE MAGNETIZATION CONFIGURATION

FIELD OF THE INVENTION

The invention relates to the general field of magneto-resistive memory elements with particular reference the free layer and, more particularly, to its shape.

BACKGROUND OF THE INVENTION

Referring now to FIG. 1a, a magnetic tunneling junction (MTJ) or a giant magneto-resistance (GMR)/Spin Valve (SV) has two ferromagnetic layers, 11 and 12, separated by non-magnetic layer 13 which is a tunneling layer in a MTJ or a metal spacer layer in a GMR/SV. This basic structure has been widely studied for use as a storage element in a magnetic random access memory (MRAM). Usually, one of the ferromagnetic layers (11) has a fixed direction of magnetization (pinned reference layer), while the other layer (12) is free to switch its magnetization direction, and is called the free layer.

For MRAM applications, the MTJ or GMR stack is usually formed so as to provide shape anisotropy. This shape anisotropy comes about when the stack's shape ceases to be circular, typically being replaced by an ellipse. In its quiescent state, the free layer magnetization lies along the long axis of the cell (in FIG. 1b this is the X direction) and is either parallel or antiparallel to the direction of magnetization of the pinned layer. This long axis is referred to as the easy axis (x), and the direction perpendicular to it is the hard axis (y).

Digital information is thus encoded as the direction of magnetization in the free layer. FIG. 2 shows the resistance R of such a MTJ element as a function of external field Hs along the orientation of the pinned layer magnetization. When the field is off, the two states with minimum and maximum resistances correspond, respectively, to the free layer magnetization being substantially parallel or anti-parallel to the pinned layer magnetization. The field required to switch between the two states (Hs) is determined by the shape anisotropy energy of the element. When an additional external field is applied along the hard axis, at the same time, the value of Hs is reduced, reaching zero when the hard axis field reaches its saturation value ($HY_{sat}$).

In MRAM applications, the two external fields used to program a given MRAM cell (designated 31 in FIG. 3) are generated by a pair of orthogonal current lines. Bit line 32 provides the easy axis field while word line 33 provides the hard axis field. To program a cell, both bit and word line currents are applied, the combination of these two fields overcoming the shape anisotropy and thereby setting the magnetization of the selected cell into a desired direction. However, although cell 31 is the selected cell, many other cells in the activated bit or word lines, though not intended to be programmed, are also exposed to fields from the bit or word line currents. Although these fields are smaller than the combined field at the selected cell, these cells can still be accidentally programmed, thereby causing an error. Cells of this type are referred to as half-select cells.

It follows from the above discussion that the values of both bit and word currents have to be carefully set—too low and the selected cell cannot be programmed reliably, too high and errors may occur in half-selected cells. The MRAM programming window is determined by 3 boundaries: the field line need to reliably write the selected cells, the distance between the bit line field to the smallest Hs at $I_{word}=0$, and the distance between the bit line field to the smallest Hs at $I_{word}$.

This window can be increased by increasing the shape anisotropy value. However such an approach demands higher bit and word currents which is undesirable in high density applications. An alternative approach (such as disclosed in U.S. Pat. No. 6,798,690 B1 and U.S. Pat. No. 6,798,691 B1) is to increase Hs at $I_{word}=0$ while maintaining Hs at $I_{word}$, by causing the free layer magnetization to be confined to a "C" shape (see FIG. 4a) so that, during switching, transient domain wall 41 (see FIG. 4c) is formed inside the cell. This can be achieved by patterning the MTJ cell into such "C" shapes. Free layers shaped this way will have higher Hs, as described by Ref.[1]. This C-state switching process is illustrated in finer detail by FIGS. 4a to 4e where the magnetizations in the two curved tip regions serve to guide the magnetization of the central region into the opposite direction. The creation of the transient domain configuration seen in FIG. 4c increases the energy barrier needed to switch the magnetization, i.e. it results in a higher value for Hs.

Once it enters the high hard axis field region, the switching behavior of the C-state returns to normal rotational mode. Thus for the C-state cells, the distance between the bit line field to the smallest Hs at $I_{word}=0$ is significantly increased. The conventional MRAM write operating point is set near the inflection point of the curves using combination fields generated by both word line and bit line, as indicated in the FIG. 6. Curve 63 is for the ellipse while curve 64 is for the C-shape.

Another approach to handling these two "half-select" issues has been to employ a segmented array architecture (U.S. Pat. No. 6,335,890 and U.S. Pat. No. 6,490,217). The segmented write field operating point 62 is also shown in FIG. 6 while a schematic layout for this architecture is depicted in FIG. 5. It also provides a technique for overcoming the limitations of conventional write selection schemes. By way of example only, a write operation directed to a specific segmented group, e.g., 334 in FIG. 5 will now be described. The illustrative select line memory array 300 directs the application of a destabilizing hard axis magnetic field to a subset of memory cells, namely, those memory cells associated with segmented group 334. All memory elements (i.e. 342 and 344) within the intended segmented group 334 are written simultaneously.

An unselected segmented group (e.g. 336) sharing a common write word line 386 with segmented group 334 does not receive a half-select field along its hard axis, even when the group select switch (e.g., 376) corresponding to the unselected segmented group 336 is enabled. This is primarily due to the fact that only one segmented bit slice among adjacent segmented bit slices, e.g., segmented bit slices N and N+1, can receive a destabilizing write current at any given time. Consequently, the magnitude of the hard axis field can be increased without disturbing the state of an unselected memory cell. Since all memory cells experiencing a hard axis field will, by definition, be written simultaneously, there are no half-selected memory cells along the word dimension using the segment write architecture.

With the segmented write architecture, the magnitude of the easy axis field (used to write the state of a memory cell) can be substantially decreased. The write margin between selected and half-selected cells is significantly increased. Moreover, because a large easy axis field is not required by the select line architecture of the invention, the bit line current required to write the memory cells can be significantly reduced, thus reducing the overall write current required by the memory array 300.

[1] "Switching field variation in patterned submicron magnetic film elements", Youfeng Zheng, Jian-Gang Zhu, J. Appl. Phys. 81(8), 15, P5471, 1997

In addition to the reference cited above, a routine search of the prior art was performed with the following additional references of interest being found:

In U.S. Patent Application 2006/0013039, Braun et al. show a star-lobed structure for 2 bits storage. Their free layer magnetization has two easy axis directions 45 degree apart. U.S. Patent Application 2005/0242384 (Iwata et al) shows cruciform shapes, but this is along word/bit lines. U.S. Pat. No. 7,020,015 (Hong et al) shows a circle with a wedge removed and U-shaped structures both of which are variations of the basic "C" shape, while Hosotani, in U.S. Pat. No. 7,239,545, discloses first and second MTJ structures that together make an X-shape; i.e. two MTJs that store two bits and lie at an angle of 45 degrees to one another.

SUMMARY OF THE INVENTION

It has been an object of at least one embodiment of the present invention to eliminate the half-select problem from magneto-resistive based MRAMs.

Another object of at least one embodiment of the present invention has been to increase the value of the easy axis field when the hard axis field is close to zero.

Still another object of at least one embodiment of the present invention has been to eliminate said half-select problem without increasing programming currents.

A further object of at least one embodiment of the present invention has been to eliminate the half select problem without using a segmented-array architecture.

These objects have been achieved by giving the free layer a shape that approximates an X so that, when the free layer switches, the magnetization in the arms of the X guides the magnetization in the central section (the X's intersection area) so that it rotates towards the hard axis in two opposing directions. This raises the free layer's switching energy barrier, thereby reducing half-select errors.

The invention discloses the detailed design rules for forming such a free layer and presents data confirming that, relative to an elliptically shaped free layer, the X-shape results in about a 5× increase of the easy axis field at zero hard axis field. Even relative to the C-shape, there is about a 3× increase. This improvement effectively solves the half-select problem.

BRIEF DESCRIPTION OF THE DRAWINGS

FIGS. 1a and 1b provide schematic views of a free layer of the prior art,

FIG. 2 shows how the electrical resistance of the free layer changes under the influence of an external field.

FIG. 3 shows how a given cell in an MRAM is individually selected.

FIGS. 7a-7d illustrate how switching occurs in a free layer shaped according to the teachings of the present invention.

FIGS. 8a-8g show variations on the schematic X-shape shown in FIG. 7.

DESCRIPTION OF THE PREFERRED EMBODIMENTS

The invention discloses a new design for the shape of the free layer in a magneto-resistive device that is part of an MRAM. This design confines the quiescent free layer magnetization in a new state, the cross-tie (x-tie) state, as schematically illustrated by the example shown in FIG. 7a. The key feature of this design is that there are branches 71 that extend away from the top and/or bottom corners of the cell in the same general direction as a diagonal while also bending somewhat towards the hard axis direction. This type of cell shape forces the quiescent magnetization states of the free layer into a cross-tie (x-tie) configuration, as indicated by the arrows in FIG. 7a.

Figures 7A, 7B:
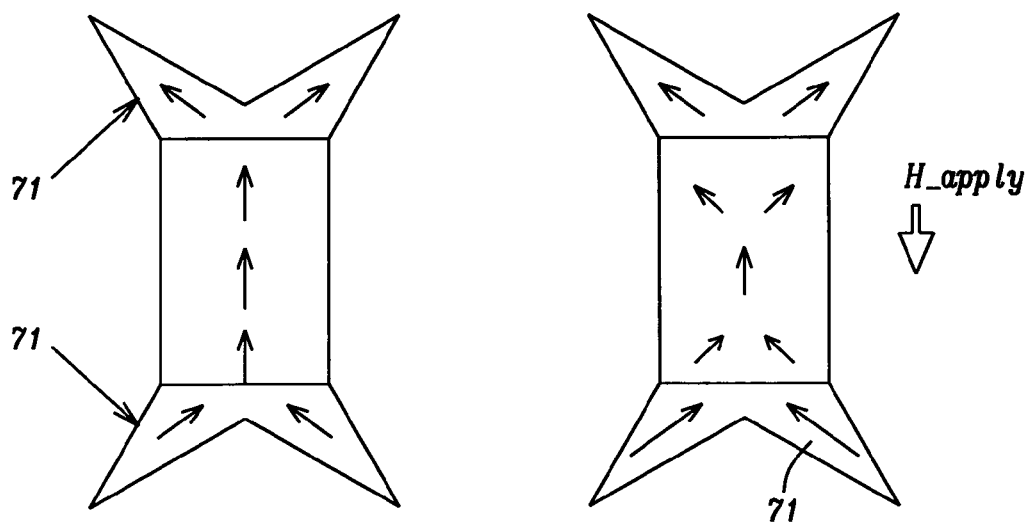
Figure 8C:
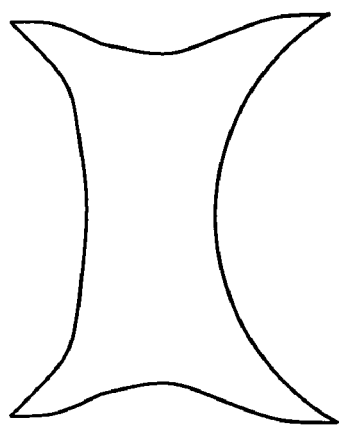
Figure 8D:
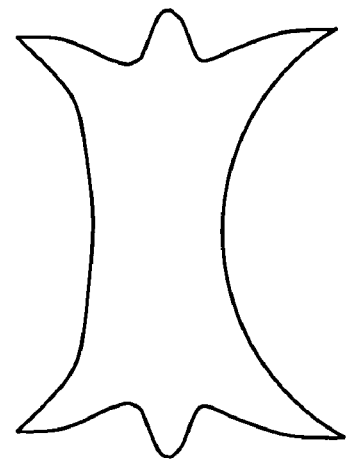
Figure 8E:
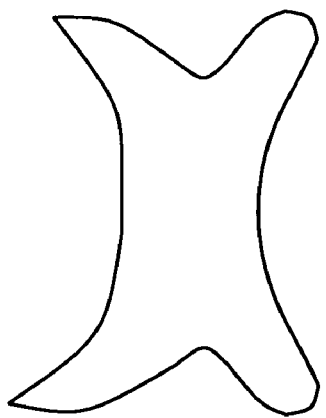
Figure 8F:
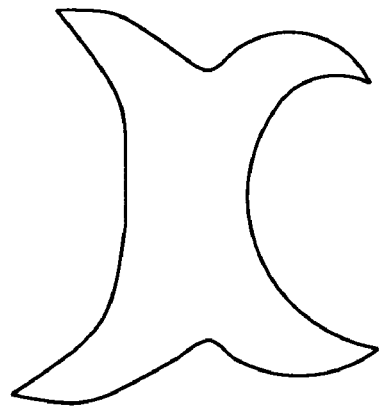
Figure 8G:
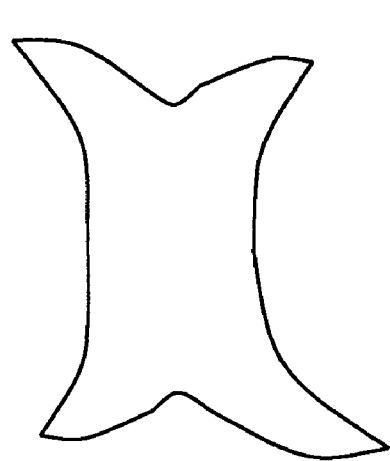

During switching, the magnetization in the branches serves to guide the central magnetization to rotate toward the hard axis, but in opposite directions (see FIG. 7b), creating, at switching, a pair of transient domain walls of opposite sign to each other (simplistically illustrated in FIG. 7c). These transient domain walls 72 and 73 that separate domains of opposite sign significantly increase the energy barrier to switching to the other quiescent state seen in FIG. 7d, and hence Hs. As a result, this x-tie state switching will increase the half-select margin along the bit line.

Figure 4A:
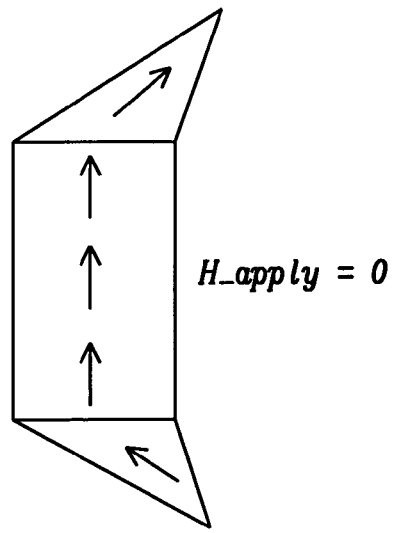
FIGS. 4a-4e illustrate how a C-shaped free layer switches.
Figure 4B:
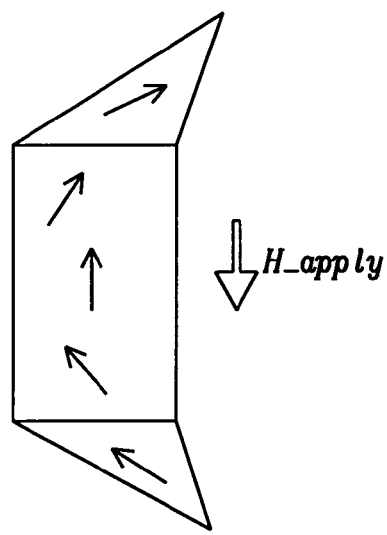
Figure 4C:
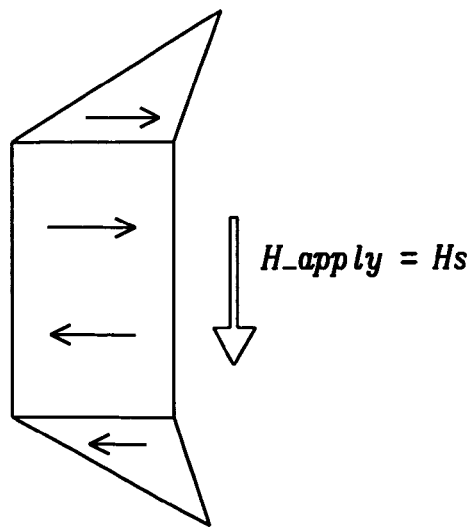
Figure 4D:
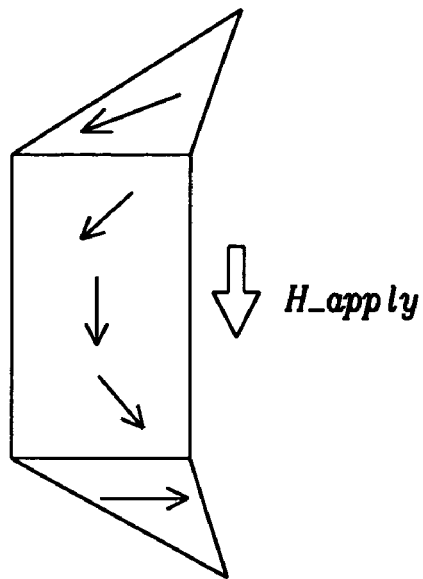
Figure 4E:
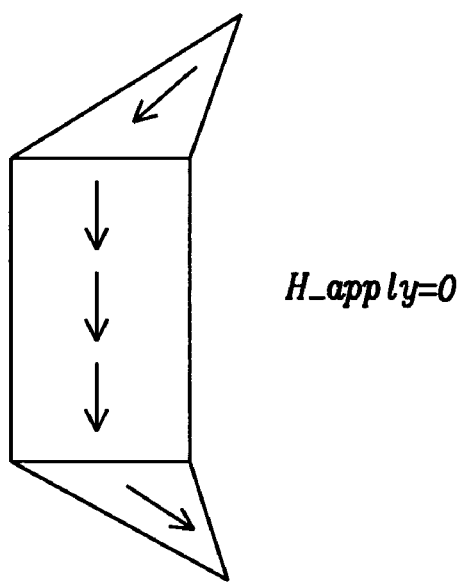
Figure 5:
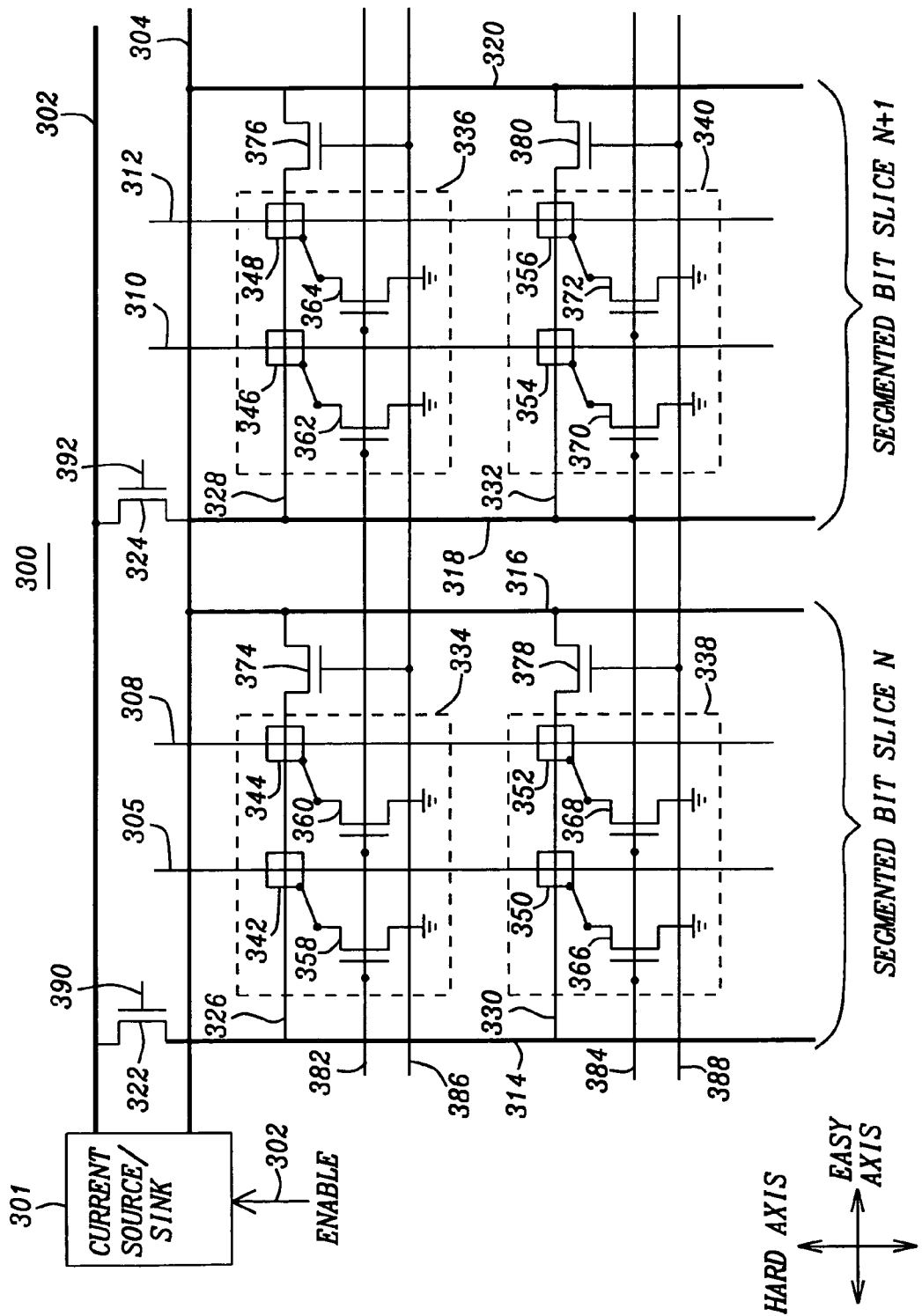
FIG. 5 is a schematic layout of a segmented array.
Figure 6:
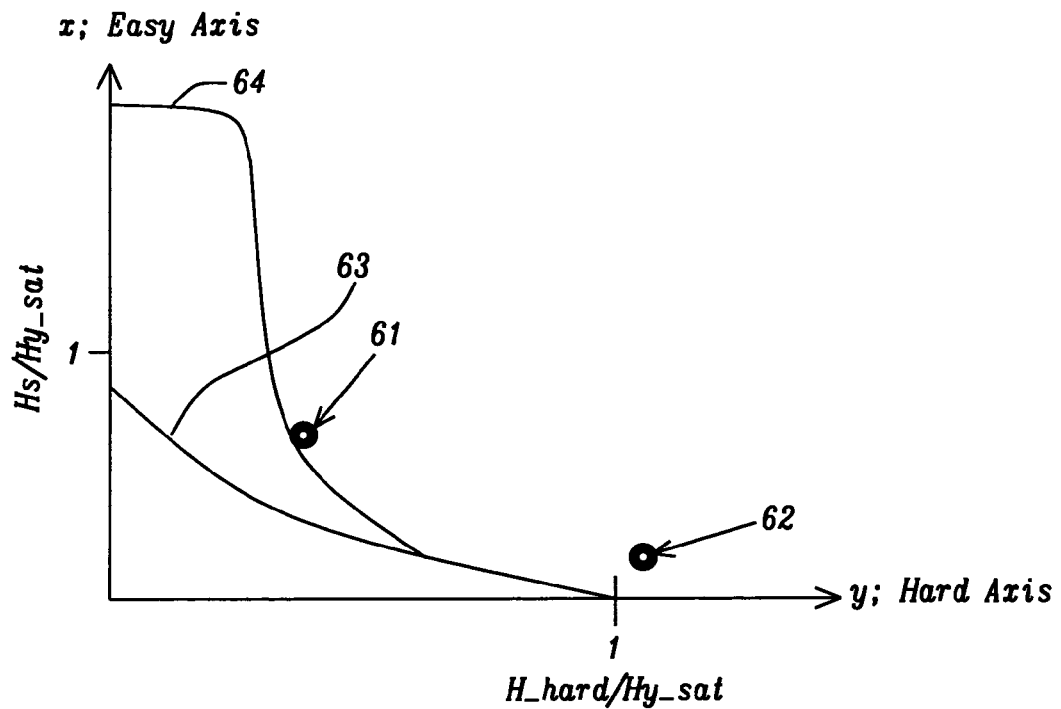
FIG. 6 shows plots of easy axis field as a function of hard axis field conventional switching, C switching, and segmented array switching.
Figure 10:
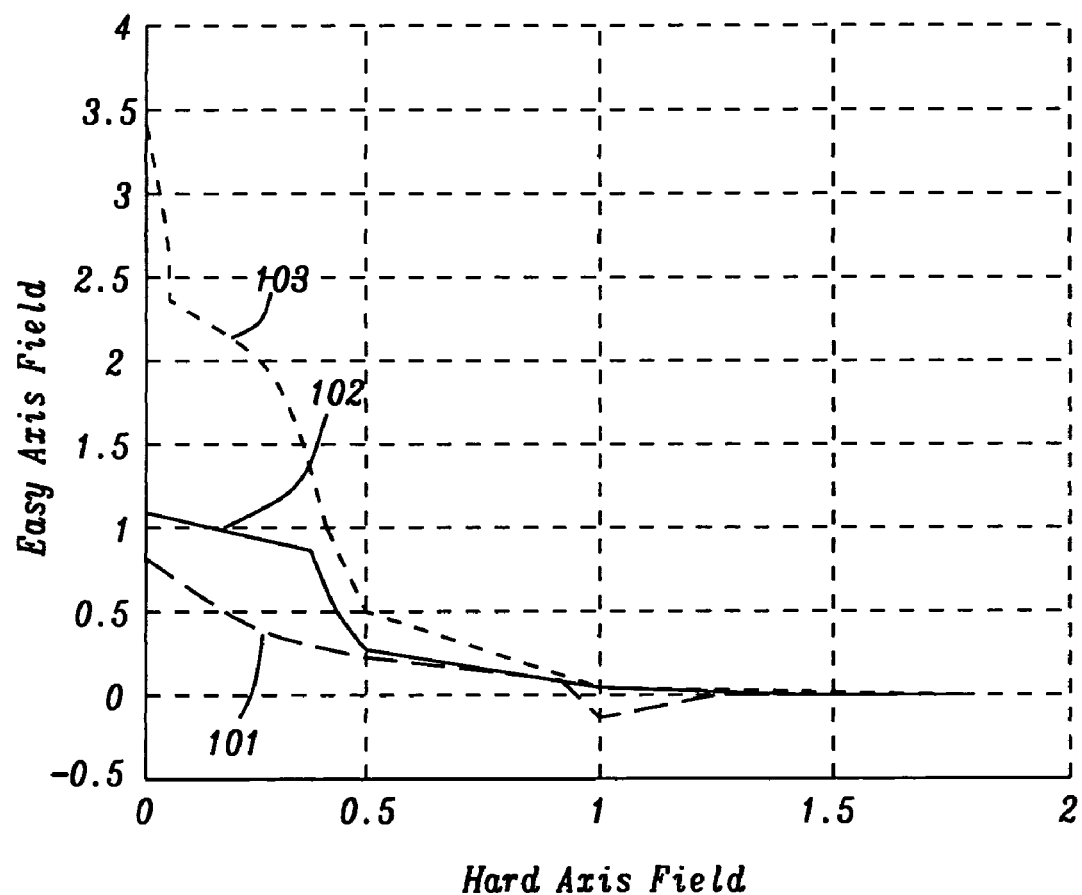
FIG. 10 compares easy axis field vs. hard axis field data for elliptical, C-shaped, and X-shaped free layers.

Note that if two C-shaped cells were placed back-to-back there would be no increase in the switching energy barrier since both domain walls would be operating in parallel. When the X-tie configuration of the present invention is used, however, a substantial increase in the barrier energy results. This can be seen in FIG. 10 which compares the calculated switching astroids (similar to the curves shown earlier in FIG. 6) of an ellipse (curve 101), a C-shape (curve 102) and an X-shape (curve 103). As can be seen, relative to an elliptically shaped free layer, the X-shape (curve 103) shows about a 5× increase of the easy axis field at zero hard axis field. Even relative to the C-shape, there is about a 3× increase. This improvement effectively solves the half-select problem discussed above.

A variety of shapes are possible that, as taught by the present invention, enable the shape anisotropy to guide the quiescent magnetization into an Xtie-state, thereby obtaining very high Hs at low hard axis field. This, in turn, largely eliminates the half-select problem discussed above.

Figure 9A:
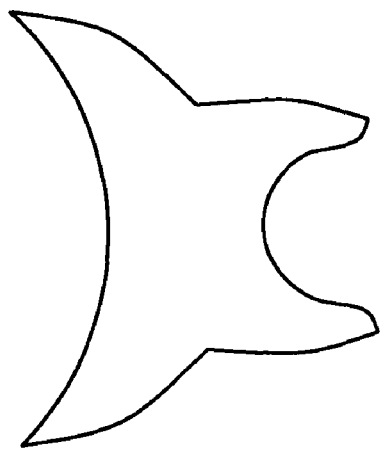
FIGS. 9a and 9b show additional shape variations.
Figure 9B:
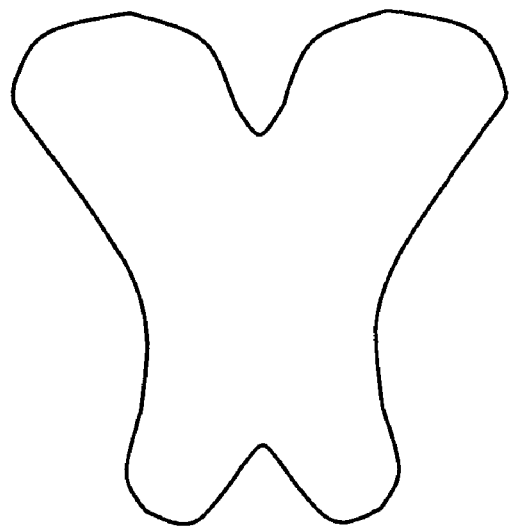

The main characteristics that define the shape taught by the present invention are seen in FIGS. 7-9. They are:

central section 71 that is approximately rectangular;

branches 72 (extensions of the central section) that originate at each of the four corners;

each branch 72 runs in a direction that is roughly parallel to a diagonal but may reduce its width and/or change its direction (always by tilting towards the hard axis direction) as it gets further from the central section;

branches 72 may have ends that come to a point (as in FIG. 7a) or the ends may be curved (see for example FIGS. 7b and 8a);

as a design option, there may be additional branches (such as 82 in FIG. 8d) that originate at either or both of the central section's short sides, but no additional branch sections are allowed to originate at one of the central section's long sides;

there is no requirement that the shape be multiply symmetric (FIGS. 8a-8d), partly symmetric (FIGS. 9a and 9b) or that it have even a single axis of symmetry (FIGS. 8e and 8g); and termination of any given branch section can be as a point or as a rounded edge.

Dimensions for the free layer shape that are disclosed in the present invention include:

Each of the central region's short sides measured between 0.001 and 1.0 microns, with between 0.01 and 0.5 microns being preferred. Each of the long sides measured between 0.001 and 1.0 microns, with between 0.01 and 0.5 microns being preferred, while one of the long sides was, typically, between 1.1 and 5 times as long as one of the short sides.

Each of the branch sections had an average width between 0.0001 and 0.5, with between 0.001 and 0.1 microns being preferred, a length between 0.0001 and 0.5, with between 0.001 and 0.1 microns being preferred and an average length to width ratio of between 1.1 and 10 with between 1.1 and 3.0 microns being preferred.

What is claimed is:

1. A magnetically free layer, having a shape comprising:
a central section having an approximately rectangular shape that includes two opposing short sides that each have a width, two opposing long sides that each have a length, and four corners, from each of which there extends, in a direction that is approximately parallel to a diagonal of said central section, a branch section;

in proportion to its distance from its originating corner, said branch section optionally tilting towards said short side; and optionally, one or more additional branch sections that originate at one of said short sides and extend away therefrom, there being no branch sections that originate at one of said long sides.

2. The magnetically free layer described in claim 1 wherein said magnetically free layer is in contact with a non-magnetic layer which, in turn is in contact with a magnetically pinned reference layer, whereby said magnetically free layer is part of a magneto-resistive device selected from the group consisting of MTJ and GMR devices.

3. The magnetically free layer described in claim 1 wherein each of said short sides measures between 0.01 and 0.5 microns, each of said long sides measures between 0.01 and 0.5 microns, and one of said long sides is between 1.1 and 5 times as long as one of said short sides.

4. The magnetically free layer described in claim 1 wherein each of said short sides measures between 0.001 and 1.0 microns, each of said long sides measures between 0.001 and 1.0 microns, and one of said long sides is between 1.1 and 10.0 times as long as one of said short sides.

5. The magnetically free layer described in claim 1 wherein each of said branch sections has an average width between 0.001 and 0.1 microns, a length between 0.001 and 0.1 microns, and an average length to width ratio of between 1.1 and 3.0.

6. The magnetically free layer described in claim 1 wherein each of said branch sections has an average width between 0.001 and 0.5 microns, a length between 0.001 and 0.5 microns, and an average length to width ratio of between 0.001 and 0.5.

7. The magnetically free layer described in claim 1 wherein one or more of said branch sections terminates as a point or as a rounded edge.

8. The magnetically free layer shape described in claim 1 wherein no axis of symmetry is present.

9. A method to reduce errors associated with half-selection in an array of magneto-resistive devices that each include a free layer having a hard axis, comprising:

patterning said free layer into a shape that further comprises:

a central section having an approximately rectangular shape that includes two opposing short sides that each have a width, two opposing long sides that each have a length, and four corners, from each of which there extends, in a direction that is approximately parallel to a diagonal of said central section, a branch section;

whereby, when said free layer switches, existing magnetization in said branches serves to guide magnetization in said central section to rotate toward said hard axis in two opposing directions; and thereby raising said free layer's switching energy barrier and thus reducing said half-selection errors.

10. The method recited in claim 9 wherein, at a hard axis field of zero, said free layer has an easy axis field that is at least 5 times that of an elliptically shaped free layer whose hard axis field is zero.

11. The method recited in claim 9 wherein each of said short sides measures between 0.01 and 0.5 microns, each of said long sides measures between 0.01 and 0.5 microns, and one of said long sides is between 1.1 and 3.0 times as long as one of said short sides.

12. The method recited in claim 9 wherein each of said short sides measures between 0.001 and 1.0 microns, each of said long sides measures between 0.001 and 1.0 microns, and one of said long sides is between 1.1 and 10.0 times as long as one of said short sides.

13. The method recited in claim 9 wherein each of said branch sections has an average width between 0.001 and 0.1 microns, a length between 0.001 and 0.1 microns, and an average length to width ratio of between 1.1 and 3.0.

14. The method recited in claim 9 wherein each of said branch sections has an average width between 0.001 and 0.5 microns, a length between 0.001 and 0.5 microns, and an average length to width ratio of between 0.001 and 0.5.

15. The method recited in claim 9 wherein one or more of said branch sections terminates as a point or as a rounded edge.

16. The method recited in claim 9 wherein there is no axis of symmetry in said free layer shape.

17. A Magnetic Random Access Memory (MRAM), including a magnetically free layer having a shape, comprising:

a plurality of magneto-resistive (MR) devices connected to form an array of rows and columns such that each row intersects each column only once, each of said MR devices further comprising a transition layer disposed to lie between a pinned reference layer and said magnetically free layer;

said magnetically free layer further comprising:

a central section having an approximately rectangular shape that includes two opposing short sides that each have a width, two opposing long sides that each have a length, and four corners, from each of which there extends, in a direction that is approximately parallel to a diagonal of said central section, a branch section;

in proportion to its distance from its originating corner, said branch section optionally tilting towards said short side; and optionally, one or more additional branch sections that originate at one of said short sides and extend away therefrom, there being no branch sections that originate at one of said long sides.

18. The MRAM described in claim 17 wherein said MR device is selected from the group consisting of MTJ and GMR devices.

19. The MRAM described in claim 17 wherein each of said short sides measures between 0.01 and 0.5 microns, each of said long sides measures between 0.01 and 0.5 microns, and one of said long sides is between 1.1 and 5 times as long as one of said short sides.

20. The MRAM described in claim 17 wherein each of said short sides measures between 0.001 and 1.0 microns, each of said long sides measures between 0.001 and 1.0 microns, and one of said long sides is between 1.1 and 10.0 times as long as one of said short sides.

21. The MRAM described in claim 17 wherein one or more of said branch sections terminates as a point or as a rounded edge.

22. The MRAM described in claim 17 wherein no axis of symmetry is present in said magnetically free layer shape.

* * * * *